US006202915B1

(12) United States Patent
Sato

(10) Patent No.: US 6,202,915 B1
(45) Date of Patent: Mar. 20, 2001

(54) ULTRASONIC VIBRATION BONDING METHOD

(75) Inventor: Shigeru Sato, Fukuoka (JP)

(73) Assignee: Ultex Corporation, Fukuoka (JP)

( * ) Notice: Subject to any disclaimer, the term of this patent is extended or adjusted under 35 U.S.C. 154(b) by 0 days.

(21) Appl. No.: 09/456,982

(22) Filed: Dec. 7, 1999

(30) Foreign Application Priority Data

Dec. 10, 1998 (JP) .................................................. 10-351821
Dec. 14, 1998 (JP) .................................................. 10-354259
Feb. 9, 1999 (JP) .................................................. 11-030789

(51) Int. Cl.[7] .................................................. B23K 1/06
(52) U.S. Cl. .................. 228/110.1; 228/1.1; 228/106; 156/73.1
(58) Field of Search .................. 228/4.5, 1.1, 110.1, 228/180.5, 5.5, 106; 156/73.1

(56) References Cited

U.S. PATENT DOCUMENTS

| | | | |
|---|---|---|---|
| 3,581,969 | * 6/1971 | Bodine | 228/1 |
| 3,627,190 | * 12/1971 | Ramsey | 228/4 |
| 3,844,869 | * 10/1974 | Rust, Jr. | 156/358 |
| 3,863,826 | * 2/1975 | Shoh | 228/1 |
| 4,037,178 | * 7/1977 | Cornett et al. | 333/71 |
| 4,366,406 | * 12/1982 | Smith et al. | 310/334 |
| 4,439,916 | * 4/1984 | Faber | 29/623.4 |
| 4,582,240 | * 4/1986 | Lux et al. | 228/121 |
| 5,427,301 | * 6/1995 | Pham et al. | 228/110.1 |
| 5,442,251 | * 8/1995 | Kaida et al. | 310/321 |
| 5,603,444 | * 2/1997 | Sato | 228/1.1 |
| 5,655,700 | * 8/1997 | Pham et al. | 228/106 |
| 5,658,408 | * 8/1997 | Frantz et al. | 156/64 |
| 5,730,832 | * 3/1998 | Sato et al. | 156/499 |
| 5,846,377 | * 12/1998 | Frantz et al. | 156/359 |
| 5,883,460 | * 3/1999 | Sato et al. | 310/348 |
| 5,884,831 | * 3/1999 | Sato et al. | 228/6.2 |
| 5,884,833 | * 3/1999 | Sato et al. | 228/36 |

FOREIGN PATENT DOCUMENTS

358028337 * 2/1983 (JP) .

OTHER PUBLICATIONS

Metals Handbook 9th Ed. vol. 6, pp. 746–756, 1983.*

* cited by examiner

Primary Examiner—Patrick Ryan
Assistant Examiner—Kiley Stoner
(74) Attorney, Agent, or Firm—Kanesaka & Takeuchi

(57) ABSTRACT

An ultrasonic vibration bonding method comprising placing metal portions to be bonded formed on a base portion of a first member upon metal portions to be bonded of a second member, pressing the first and second members with a resonator and a mounting table elastically while the base portion of the first member is located on a bonding working portion side of the resonator and the second member is located on a mounting table side, and bonding together the portions to be bonded of the first and second members with ultrasonic vibration transmitted to the resonator from a transducer. This ultrasonic vibration bonding method can improve work efficiency and prevent a connection failure and resin breakage.

6 Claims, 6 Drawing Sheets

ULTRASONIC VIBRATION BONDING METHOD

BACKGROUND OF THE INVENTION

1. Field of the Invention

The present invention relates to an ultrasonic vibration bonding method for bonding metal portions to be bonded of a first member to metal portions to be bonded of a second member with ultrasonic vibration transmitted to a resonator from a transducer.

2. Description of the Prior Art

It has already been known that an ultrasonic vibration bonding method is used when an IC chip called "flip chip" or "bare chip" or an LSI package called "BGA" as a semiconductor device is to be mounted on the surface of a circuit board. That is, gold or solder bumps formed on the surface of an IC chip or LSI package are placed upon gold or solder bumps formed on the surface of a circuit board, the IC chip or LSI package is located on a bonding working portion side of a resonator, the circuit board is located on a mounting table side of an ultrasonic vibration bonding apparatus, and the IC chip or LSI package and the circuit board are sandwiched between the resonator and the mounting table by pressure. In this state, the portions to be bonded of the first member and the second member are bonded together with ultrasonic vibration transmitted to the resonator from the transducer.

SUMMARY OF THE INVENTION

However, the IC chip or LSI package and the circuit board which are the first and second members have thickness nonuniformity within a tolerable range. By this nonuniformity, during bonding, portions having low bonding strength may be formed in the portions to be bonded of the first and second members and these portions having low bonding strength may be separated from each other after bonding.

It is therefore an object of the present invention to provide an ultrasonic vibration bonding method which can prevent the bonded portions of the first and second members from being separated from each other.

According to a first aspect of the present invention, there is provided an ultrasonic vibration bonding method comprising the steps of placing metal portions to be bonded formed on a base portion of a first member upon metal portions to be bonded of a second member, pressing the first and second members with a resonator and a mounting table elastically while the base portion of the first member is located on a bonding working portion side of the resonator and the second member is located on the mounting table side, and bonding together the portions to be bonded of the first and second members with ultrasonic vibration transmitted to the resonator from a transducer.

According to a second aspect of the present invention, there is provided an ultrasonic vibration bonding method, wherein the resonator is supported by a holder of a pressing unit at both ends.

According to a third aspect of the present invention, there is provided an ultrasonic vibration bonding method, wherein the base portion of the first member is made from a synthetic resin.

According to a fourth aspect of the present invention, there is provided an ultrasonic vibration bonding method, wherein the synthetic resin has flexibility.

According to a fifth aspect of the present invention, there is provided an ultrasonic vibration bonding method, wherein the second member has a base portion on which the portions to be bonded are formed and the base portion of the second member is located on the mounting table side.

According to a sixth aspect of the present invention, there is provided an ultrasonic vibration bonding method, wherein a buffer member is inserted between the bonding working portion of the resonator and the base portion of the first member.

According to a seventh aspect of the present invention, there is provided an ultrasonic vibration bonding method, wherein the base portion of the first member is weak against impact.

According to an eighth aspect of the present invention, there is provided an ultrasonic vibration bonding method, wherein the second member has a base portion on which the portions to be bonded are formed and the base portion of the second member is located on the mounting table side.

According to a ninth aspect of the present invention, there is provided an ultrasonic vibration bonding method, wherein the buffer member is a layer which can contact at least the entire surface of the bonding working portion of the resonator and the entire surface of the base portion of the first member.

According to a tenth aspect of the present invention, there is provided an ultrasonic vibration bonding method, wherein the buffer member is provided on the bonding working portion of the resonator.

According to an eleventh aspect of the present invention, there is provided an ultrasonic vibration bonding method, wherein the buffer member is provided on the base portion of the first member.

According to a twelfth aspect of the present invention, there is provided an ultrasonic vibration bonding method, wherein the second member has a base portion on which portions to be bonded are formed, the base portion of the second member is located on the mounting table side, the first member and the second member are placed one upon the other with an insulating adhesive therebetween, the adhesive is pressed into spaces between the base portion of the first member and the base portion of the second member from between the portions to be bonded of the first and second members with ultrasonic vibration when the portions to be bonded of the first and second members are bonded together with ultrasonic vibration from the resonator, and the base portions of the first and second members are bonded together with this adhesive.

According to a thirteenth aspect of the present invention, there is provided an ultrasonic vibration bonding method, wherein the adhesive is thermosetting.

According to a fourteenth aspect of the present invention, there is provided an ultrasonic vibration bonding method, wherein the adhesive is non-thermosetting.

The above and other objects, features and advantages of the invention will become more apparent from the following description when taken in conjunction with the accompanying drawings.

BRIEF DESCRIPTION OF THE ACCOMPANYING DRAWINGS

DETAILED DESCRIPTION OF THE PREFERRED EMBODIMENTS

Embodiment 1

Figure 1:
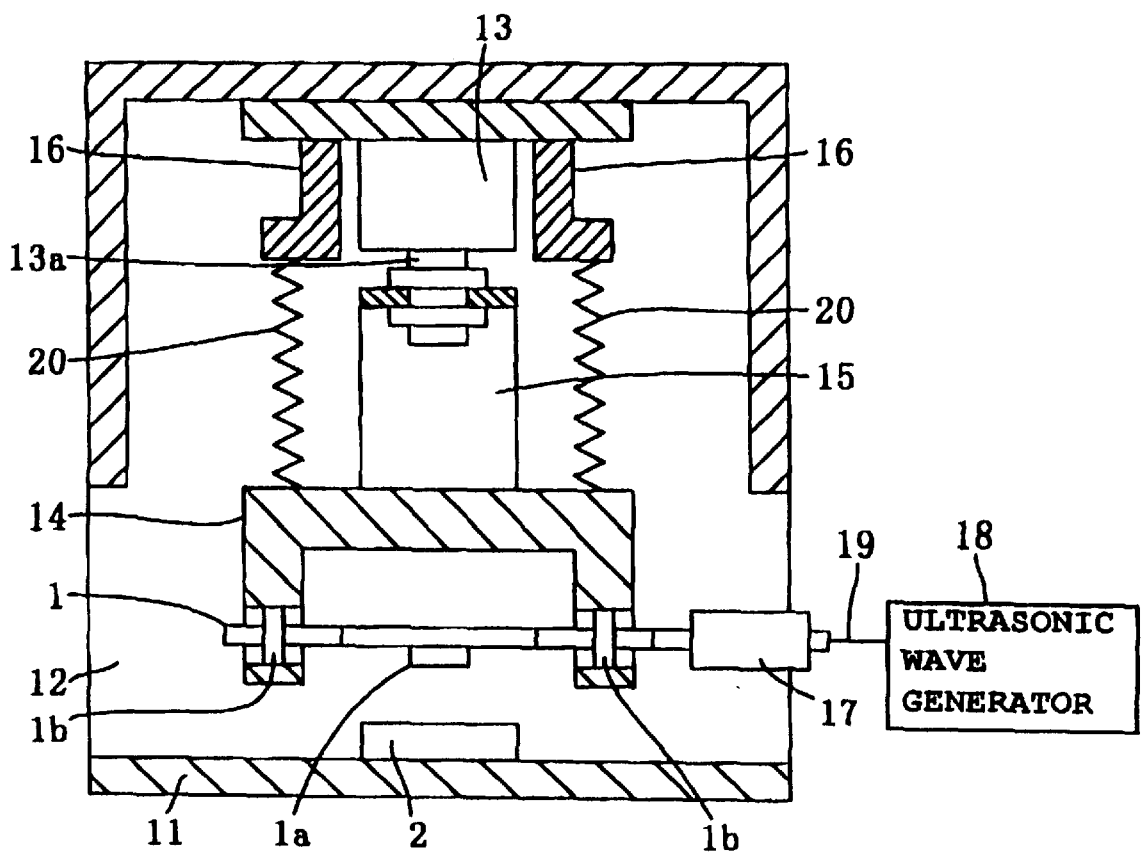
FIG. 1 is a longitudinal sectional view of an ultrasonic vibration bonding apparatus according to Embodiment 1 of the present invention.

FIG. 1 is a longitudinal sectional view of an ultrasonic vibration bonding apparatus used in this bonding method. In FIG. 1, an apparatus body 11 has a working space 12 which is made open in a front direction and a horizontal direction in the front lower portion. An air cylinder 13 is installed above the working space 12 of the apparatus body 11 as a pressing unit. A holder 15 is attached to the lower end of a piston rod 13a projecting downward from the air cylinder 13 by a connecting member 15. A pair of spring sheets 16 are provided on both sides of the air cylinder 13 in the apparatus body 11 and elastic members 20 such as coil springs are connected to the spring sheets 16 and the holder 14. The elastic members 20 give upward elastic force to the holder 14 so as to prevent the holder 14 from falling by its own weight and keep the holder 14 at its upward movement limit position particularly when pressurized air for upward movement is not supplied from an unshown pressurized air supply circuit to the air cylinder 13.

The holder 14 holds both ends of a rod-like resonator 1 made from a material having excellent acoustic characteristics such as titanium in an upper portion of the working space 12 in such a manner that the resonator 1 is laid horizontally. One end of the resonator 1 is connected coaxial to a transducer 17 such as an acoustic converter or magnetorestrictive converter. In this state, the transducer 17 generates ultrasonic vibration with electric energy received from an ultrasonic wave generator 18 through an electric wire 19. The resonator 1 is formed to agree with a resonance frequency determined by a frequency transmitted from the transducer 17. The resonator 1 has the maximum vibration amplitude point of the resonance frequency at least at both ends and has a bonding working portion 1a projecting from its peripheral surface at the center. The bonding working portion 1a has at least substantially the same flat surface as that of the base portion 3a of a first member 3 shown in step 201 of FIG. 2.

The resonator 1 is attached to the holder 14 in such a manner that ring-shaped support portions 1b projecting from the peripheral surface at two minimum vibration amplitude points between the maximum vibration amplitude point at the center and the maximum vibration amplitude points at both ends are inserted into and mated with end portions of the holder 14. The resonator 1 may be formed as a single unit but may be formed as a composite unit consisting of a horn having the bonding working portion 1a and two boosters on both sides of the horn, which have the support portions 1b and are connected coaxial to the horn by headless screws. When the holder 14 is moved down toward a mounting table 2 by the air cylinder 13, the under surface of the resonator 1 moves down toward the mounting table 2 while maintaining parallelism between it and the flat upper surface of the mounting table 2. The mounting table 2 is installed on a lower portion of the apparatus body 11 which defines a rear portion of the working space 12. When the ultrasonic vibration bonding apparatus is installed in a production line for the surface mounting of a semiconductor device, for example, the lower portion of the apparatus is installed on a batholith constituting the base of the production line.

Figure 2:
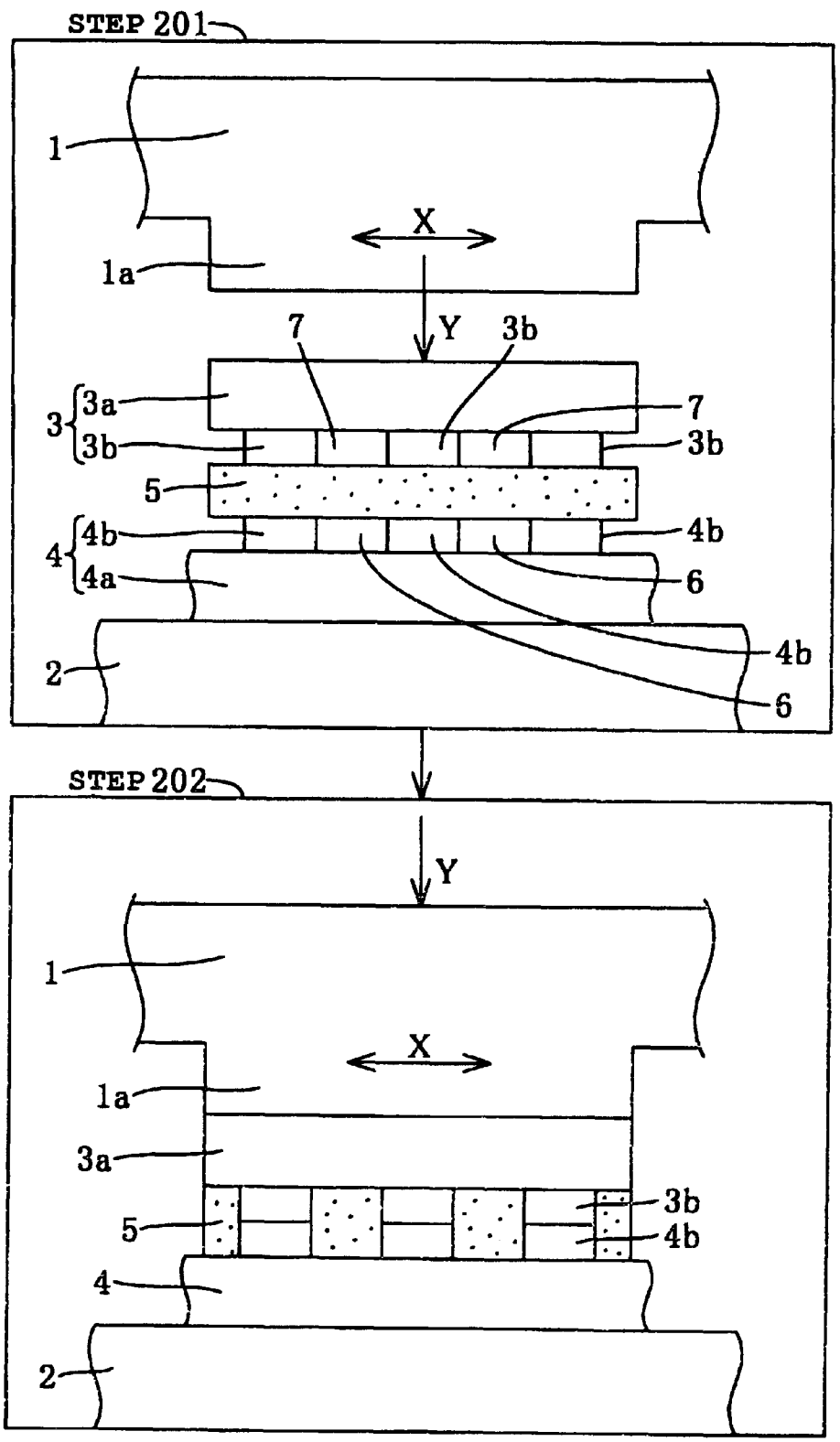
FIG. 2 is a process diagram showing the bonding method of Embodiment 1.

FIG. 2 is a process diagram showing the bonding method of Embodiment 1 of the present invention. In FIG. 2, the first member 3 has metal portions 3b to be bonded which are gold or solder bumps on the surface of a ceramic base portion 3a which is weak against impact, such as an IC chip or LSI package. A second member 4 has metal portions 4b to be bonded which are gold or solder bumps on the surface of a base portion 4a which is a circuit board such as a printed circuit board for mounting the first member 3 on the surface. It is the best from the viewpoint of bonding strength that the portions 3b and 4b to be bonded together are made from the same material, for example, when the portions 3b to be bonded are gold, the portions 4b to be bonded are also gold and when the portions 3b to be bonded are solder, the portions 4b to be bonded are also solder. The portions 3b and 4b to be bonded together may be made from different materials if they can be bonded together with ultrasonic vibration.

To carry out the bonding method of Embodiment 1, as shown in step 201 of FIG. 2, a predetermined space is first formed between the under surface of the bonding working portion 1a and the upper surface of the mounting table 2. This predetermined space is wide enough to put in and out the first member 3 and the second members 4 which are placed one upon the other with an adhesive 5 therebetween. That is, the piston rod 13a of the air cylinder 13 shown in FIG. 1 is contracted by changing the air supply route of an unshown pressurized air supply circuit, the bonding working portion 1a is moved up a predetermined distance in a direction that it parts from the mounting table 2, perpendicular to the transmission direction of ultrasonic vibration to the resonator 1 from the transducer 17, the piston rod 13a stops, and the bonding working portion 1a stops at its upward movement limit position to form the above predetermined space. While this predetermined space is formed, the first member 3 and the second member 4 sandwiching the adhesive 5 are mounted on the mounting table 2. In this case, the portions 3b and 4b to be bonded together are located at corresponding positions with the adhesive 5 therebetween, the base portion 3a is situated on the bonding working portion 1a side of the resonator 1, and the base portion 4a is situated on the mounting table 2 side. Spaces 6 and 7 are existent around the portions 3b and 4b to be bonded together.

As shown in step 202 of FIG. 2, the bonding working portion 1a descends, and the bonding working portion 1a and the mounting table 2 press the first member 3 and the second member 4 with the adhesive 5 therebetween. That is, after the piston rod 13a shown in FIG. 1 is extended in defiance of the elastic force of the elastic members 20 by changing the air supply route of the pressurized air supply circuit, the bonding working portion 1a descends and presses the first member 3 and the second member 4 with the adhesive 5 therebetween together with the mounting table 2. Since the adhesive 5 is slightly compressed and has elasticity, the first member 3 and the second member 4 are pressed by the bonding working portion 1a and the mounting table 2 elastically. That is, as an impact on the base portions 3a and 4a from the bonding working portion 1a and the mounting table 2 is absorbed by elastic pressing, the base portions 3a and 4a are not broken.

After or before pressing, high-frequency energy is supplied to the transducer 17 shown in FIG. 1 from the ultrasonic wave generator 18 shown in FIG. 1, the transducer 17 generates ultrasonic vibration, and the resonator 1 resonates with this ultrasonic vibration transmitted from the transducer 17. Thereby, the bonding working portion 1a vibrates with the maximum vibration amplitude in a direction shown by an arrow X perpendicular to the pressing direction shown by an arrow Y of the air cylinder 13. The adhesive 5 is pressed aside by pressure in the direction Y and horizontal vibration in the direction X received from the portions 3b and 4b to be bonded together. Thereby, part of the adhesive 5 is moved into the spaces 6 and 7 shown in step 201 from between the portions 3b and 4b to be bonded together, and the portions 3b and 4b to be bonded together are contacted to each other without the adhesive 5 and then bonded together with ultrasonic vibration which is the vibration in the direction X transmitted from the bonding working portion 1a without being molten. Along with this, the adhesive 5 pressed aside fills the spaces 6 and 7 shown in step 201 around the portions 3b and 4b to be bonded together and are cured to bond together the base portions 3a and 4a.

The adhesive 5 may be a thermosetting synthetic resin, a double coated tape of a thermosetting synthetic resin, a non-thermosetting synthetic resin which is cured at a temperature higher than the temperature of heat generated when the portions 3b and 4b are bonded together with ultrasonic vibration, or a double coated tape of a non-thermosetting synthetic resin. When a thermosetting synthetic resin or a double coated tape of a thermosetting synthetic resin is used as the adhesive 5 in this embodiment, if the thermosetting synthetic resin or the tape is cured at 130° C., for example, either one or both of the resonator 1 and the mounting table 2 may be heated with an electric heater or hot air at about 100° C. When a non-thermosetting synthetic resin or a double tape of a non-thermosetting synthetic resin is used as the adhesive 5, the resonator 1 or the mounting table 2 does not need to be heated.

Embodiment 2

Figure 3:
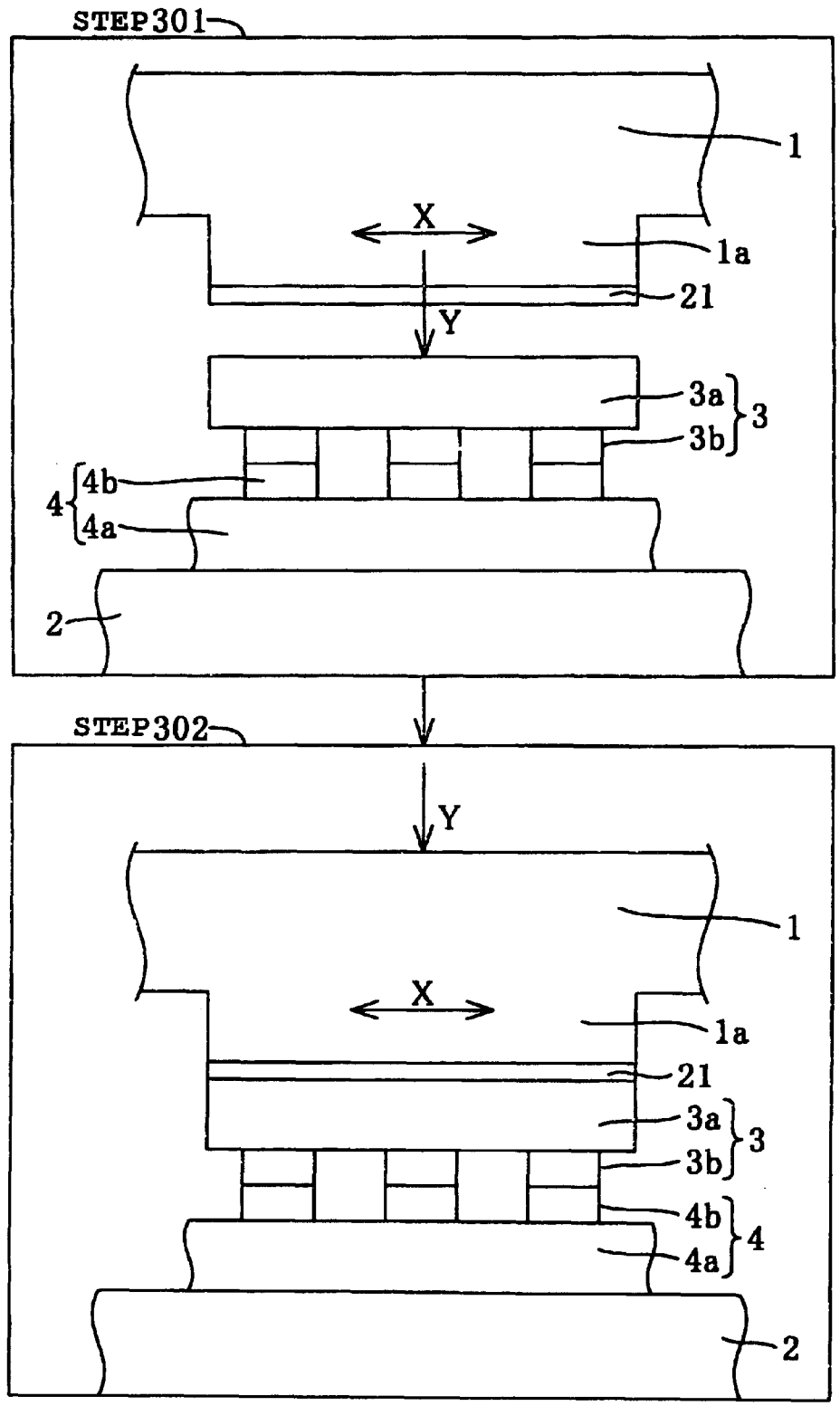
FIG. 3 is a process diagram showing the bonding method of Embodiment 2.

FIG. 3 is a process diagram showing the bonding method of Embodiment 2 of the present invention. As shown in step 301 of FIG. 3, reference numeral 21 denotes a buffer member made from a single material such as Teflon or polypropylene. The buffer member 21 is formed on the entire under surface of the bonding working portion 1a as a flat layer. The first member 3 and the second member 4 are inserted between the under surface of the bonding working portion 1a having this buffer member 21 and the upper surface of the mounting table 2 while they are placed one upon the other. In this state, the portions 3b and 4b to be bonded together are contacted to each other, the base portion 3a is located on the bonding working portion 1a side, and the base portion 4a is mounted on the mounting table 2.

Thereafter, as shown in step 302 of FIG. 3, after the piston rod 13a shown in FIG. 1 is extended by changing the air supply route of the pressurized air supply circuit, the base portion 3a is pressed by the buffer member 21, the portions 3b and 4b to be bonded together are closely contacted to each other, the base portion 4a is closely contacted to the mounting table 2, and the first member 3 and the second member 4 are pressed by the bonding working portion 1a and the mounting table 2.

Since the buffer member 21 is slightly compressed and has elasticity in this state, the first member 3 and the second member 4 are elastically pressed by the bonding working portion 1a and the mounting table 2. That is, as an impact on the base portions 3a and 4a from the bonding working portion 1a and the mounting table 2 is absorbed by elastic pressing, the base portions 3a and 4a are not broken.

Since the buffer member 21 is compressed between the base portion 3a and the bonding working portion 1a, the buffer member 21 absorbs tolerable differences in the thicknesses of the first member 3 and the second member 4 and a deviation from parallelism between the bonding working portion 1a and the mounting table 2, and all of the portions 3b to be bonded and all of the portions 4b to be bonded are bonded together. Therefore, a bonding failure between the portions 3b and 4b to be bonded together can be prevented.

Since the buffer member 21 is provided on the bonding working portion 1a, bonding work efficiency is high.

After or before pressing, high-frequency energy is supplied to the transducer 17 shown in FIG. 1 from the ultrasonic wave generator 18 shown in FIG. 1, the transducer 17 generates ultrasonic vibration, the resonator 1 resonates with this ultrasonic vibration transmitted from the transducer 17, and the bonding working portion 1a vibrates with the maximum vibration amplitude in the direction shown by the arrow X perpendicular to the pressing direction shown by the arrow Y of the air cylinder 13 shown in FIG. 1 to bond together the portions 3b and 4b with the buffer member 21 therebetween without melting them.

Embodiment 3

Figure 4:
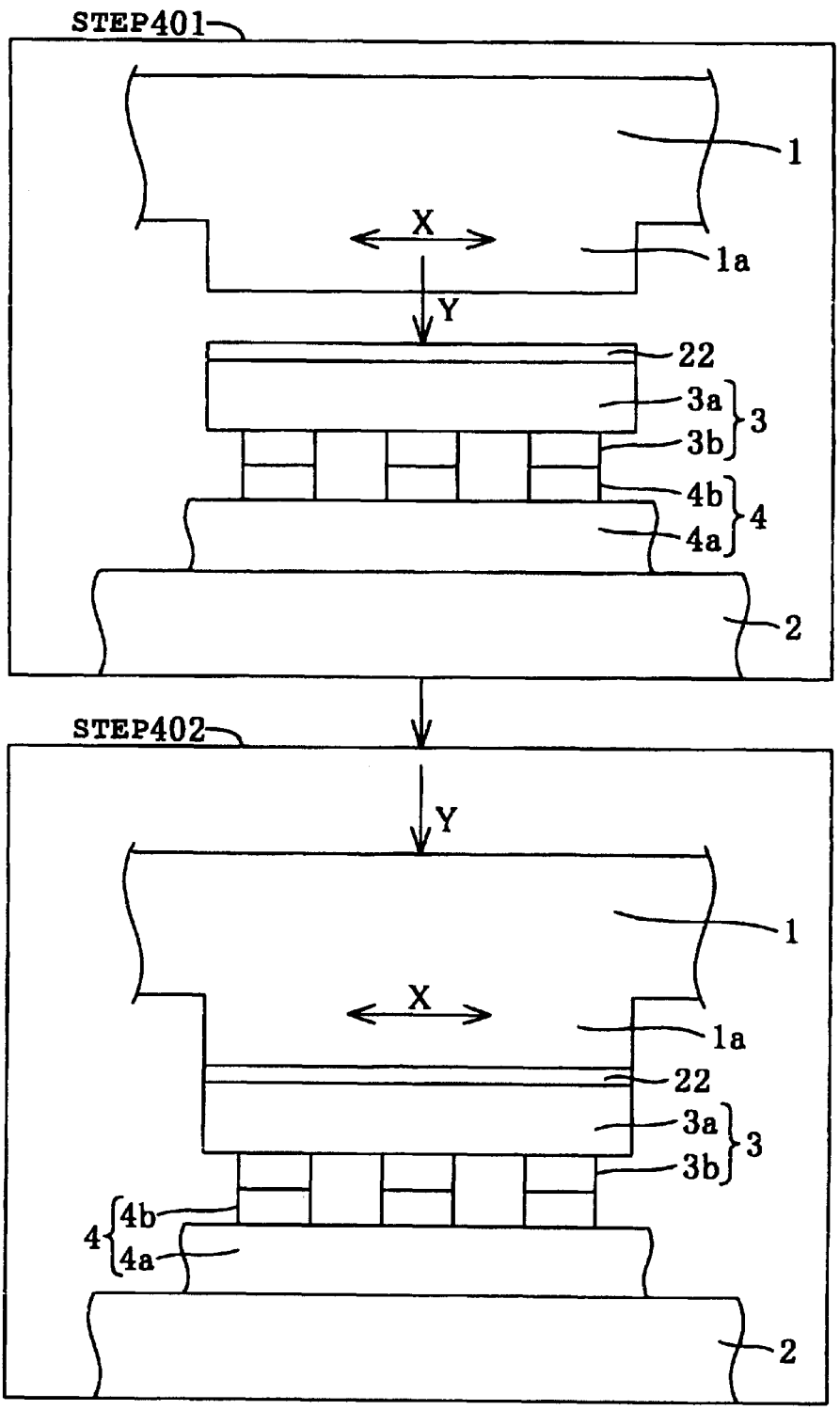
FIG. 4 is a process diagram showing the bonding method of Embodiment 3.

FIG. 4 is a process diagram showing the bonding method of Embodiment 3 of the present invention. As shown in step 401 of FIG. 4, a buffer member 22 corresponding to the above buffer member 21 is fixed to the base portion 3a. The buffer member 22 is formed on the entire upper surface of the base portion 3a as a flat layer. Therefore, according to this Embodiment 3, the buffer member 22 is exchanged each time ultrasonic vibration bonding is made, thereby making it unnecessary to take into consideration the abrasion of the buffer member 22. Step 402 of FIG. 4 is the same as step 302 of FIG. 3.

Embodiment 4

Figure 5:
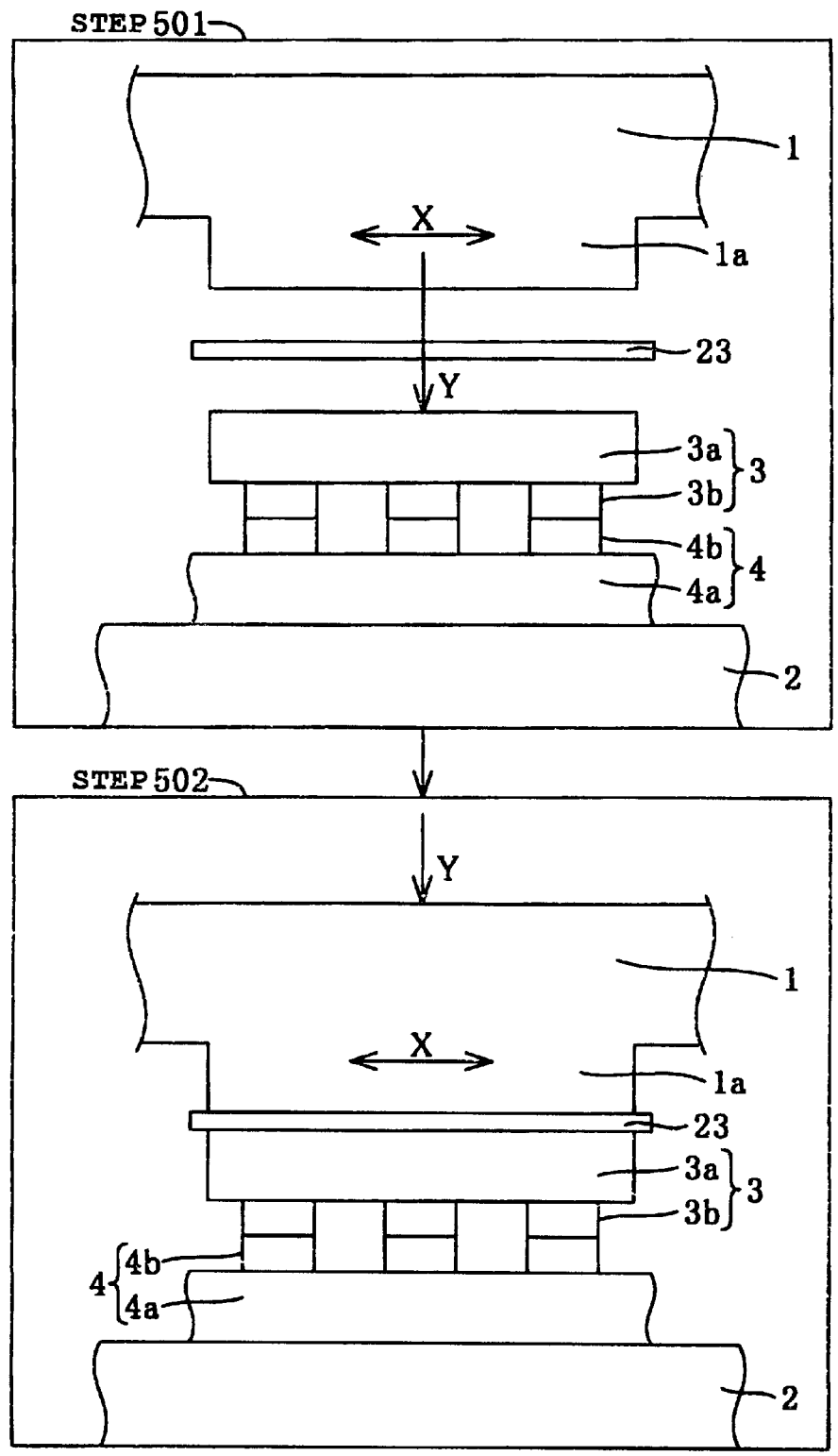
FIG. 5 is a process diagram showing the bonding method of Embodiment 4.

FIG. 5 is a process diagram showing the bonding method of Embodiment 4 of the present invention. A buffer member 23 corresponding to the above buffer member 22 is separated from the bonding working portion 1a and the base portion 3a and inserted into the space between the bonding working portion 1a and the base portion 3a before the first member 3 and the second member 4 are pressed. The buffer member 23 is sandwiched between the bonding working portion 1a and the base portion 3a by the descent of the resonator 1. Therefore, the buffer member 23 can be exchanged each time ultrasonic vibration bonding is made, and the resonator 1 and the first member 3 can be devoid of the buffer member 23. In this case, when the buffer member is supported by an unshown supporting unit, the safety of work can be ensured.

When the above buffer members 21, 22 and 23 are made from a material which hardly slips from the resonator 1 and the first member 3, bonding work efficiency is improved.

Embodiment 5

Figure 6:
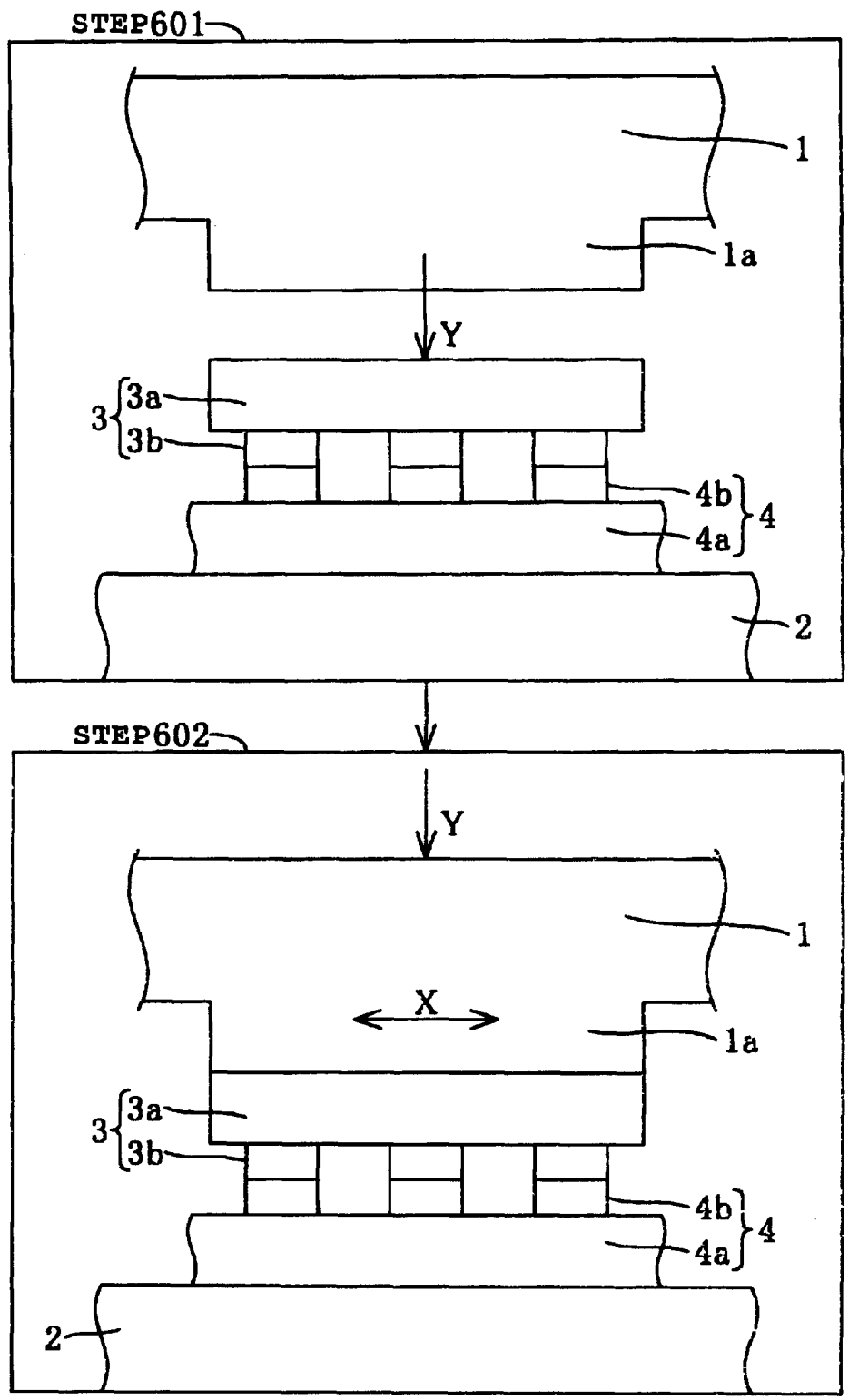
FIG. 6 is a process diagram showing the bonding method of Embodiment 5.

FIG. 6 is a process diagram showing the bonding method of Embodiment 5 of the present invention. The first member 3 and the second member 4 used as members to be bonded together in this Embodiment are flexible cables, and a plurality of metal portions 3b and 4b are formed on the surfaces of the base portions 3a and 4a made from a flexible synthetic resin at predetermined intervals, respectively. The portions 3b and 4b to be bonded together may be formed as a single layer of a copper foil, double layers consisting of a copper foil and a nickel plating layer, or multiple layers consisting of a copper foil, nickel plating layer and gold bumps, solder bumps or gold plating layer.

A description is subsequently given of the bonding method of this embodiment. To bond together the first member 3 and the second member 4, as shown in step 601 of FIG. 6, the first member 3 and the second member 4 are inserted between the under surface of the bonding working portion 1a and the upper surface of the mounting table 2 while they are placed one upon the other. In this state, the portions 3b and 4b to be bonded together are contacted to each other, the base portion 3a is located on the bonding working portion 1a side, and the base potion 4a is mounted on the mounting table 2.

Thereafter, as shown in step 602 of FIG. 6, after the piston rod 13a shown in FIG. 1 is extended by changing the air supply route of the pressurized air supply circuit, the bonding working portion 1a presses the base portion 3a, the portions 3b and 4b to be bonded together are closely contacted to each other, the base portion 4a is closely contacted to the mounting table 2, and the first member 3 and the second member 4 are pressed by the bonding working portion 1a and the mounting table 2.

Since the base portion 3a is made from a flexible synthetic resin in this state, the base portion 3a is slightly compressed and has elasticity. Therefore, the first member 3 and the second member 4 are elastically pressed by the bonding working portion 1a and the mounting table 2. After or before pressing, the resonator 1 resonates with ultrasonic vibration transmitted from the transducer 17 shown in FIG. 1, and the bonding working portion 1a vibrates with the maximum vibration amplitude in the direction shown by the arrow X perpendicular to the pressing direction shown by the arrow Y of the air cylinder 13 shown in FIG. 1 to bond together the portions 3b and 4b with the base portion 3a therebetween without melting them.

In Embodiment 5, flexible cables are used as the first member 3 and the second member 4. A combination of a flexible cable and a circuit board or a terminal, a combination of flexible circuit boards, or a combination of an IC chip or LSI package and a circuit board may be used as a combination of the first member 3 and the second member 4. The base portions 3a and 4a may be made from a hard synthetic resin having no flexibility.

In the above embodiments, since the resonator 1 is supported by the holder 14 at both ends as shown in FIG. 1, when the portions 3b and 4b are to be bonded together, the resonator 1 is not inclined, the bonding working portion 1a is uniformly contacted to the base portion 3a, and the base portion 3a is not scratched by pressure.

The surface of the bonding working portion 1a is flat. When a plurality of vertical and horizontal grooves which cross each other are formed in the surface (caramel lattice) or a plurality of oblique grooves which cross each other are formed in the surface (diamond lattice), the bonding working portion 1a support the first member 3 and the second member 4 together with the mounting table 2 at multiple points at the time of bonding. Therefore, ultrasonic vibration is well transmitted to the first member 3 and the second member 4 from the bonding working portion 1a, thereby improving the bonding of the portions 3b and 4b. When the caramel lattice or diamond lattice is formed in the surface of the bonding working portion 1a, the surface of each square of the bonding working portion 1a contacting the base portion 3a of the first member 3 at multiple points is flat, thereby making it possible to prevent the breakage of the base portion 3a.

In the above embodiments, when a heater such as an electric heater is attached to at least one of the resonator 1 and the mounting table 2 to heat the interface between the first member 3 and the second member 4 sandwiched between the bonding working portion 1a and the mounting table 2 so as to bond together the first member 3 and the second member 4 with ultrasonic vibration, the heating temperature is controlled to a level which does not exert a bad influence upon the base portion 3a of the first member 3 and the base portion 4a of the second member 4.

In the above embodiments, the resonator 1 and the mounting table 2 sandwich the first member 3 and the second member 4 by the descent of the resonator 1 when the first member 3 and the second member 4 are placed on the mounting table 2 while they are placed one upon the other. The present invention can be modified such that the holder 14, the air cylinder 13, the connecting member 15, the spring sheets 16 and the elastic members 20 are set in a movable member which can be moved horizontally in place of the apparatus body 11, a suction passage communicating with the bonding working portion 1a is connected to the resonator 1, a suction system having a suction source such as a vacuum pump and a valve is connected to the suction passage, the first member 3 is placed upon the second member 4 on the mounting table 2 by the resonator 1, and the first member 3 and the second member 4 which are placed one upon the other are sandwiched between the resonator 1 and the mounting table 2.

According to the first aspect of the present invention, since the adhesive pressed aside fills spaces around the portions to be bonded together when the portions to be bonded of the first member and the second member are to be bonded together with ultrasonic vibration, even if portions having low bonding strength are formed in the portions to be bonded of the first member and the second member, the adhesive holds the first member and the second member, thereby making it possible to eliminate such inconvenience that the portions having low bonding strength are separated from each other after bonding.

According to the second aspect of the present invention, since the adhesive is cured by heat generated from the portions to be bonded together at the time of bonding metals with ultrasonic vibration, the first member and the second member are bonded together firmly.

According to the third aspect of the present invention, since the adhesive is not cured by heat generated from the portions to be bonded together at the time of bonding metals with ultrasonic vibration, it can function as a buffer material between the first and second members.

According to the fourth aspect of the present invention, the metal portions to be bonded of the base portion which is weak against impact of the first member and the metal portions to be bonded of the second member are placed one upon the other, the base portion of the first member is located on the bonding working portion side of the resonator, the second member is located on the mounting table side, the first and the second members are sandwiched between the resonator and the mounting table by pressure, and the buffer member is sandwiched between the bonding working portion of the resonator and the base portion of the first member. Therefore, the buffer member can bear an impact on the base portion of the first member from the bonding working portion and can prevent the breakage of the base portion which is weak against impact. When the buffer member is compressed between the base portion of the first member and the bonding working portion of the resonator, the buffer member absorbs tolerable differences in the thicknesses of the first member and the second member and a deviation from parallelism between the bonding working portion and the mounting table, and the portions to be bonded of the first member and the second member are closely contacted to each other as a whole and bonded together with ultrasonic vibration, thereby making it possible to prevent a bonding failure between the portions to be bonded together.

According to the fifth aspect of the present invention, since the buffer member is provided on the bonding working portion, the buffer member does not need to be inserted between the resonator and the first member each time ultrasonic vibration bonding is made, thereby improving bonding work efficiency.

According to the sixth aspect of the present invention, since the buffer member is provided on the first member, the buffer member is exchanged each time ultrasonic vibration bonding is made. Therefore, bonding work can be made without the need of taking into consideration the abrasion of the buffer member.

According to the seventh aspect of the present invention, the metal portions to be bonded of the first member and the metal portions to be bonded of the second member are placed one upon the other, the synthetic resin base portion of the first member is located on the bonding working portion side of the resonator, the synthetic resin base portion of the second member is located on the mounting table side, the first member and the second member are sandwiched between the resonator and the mounting table by pressure, and the portions to be bonded of the first member and the second member are bonded together with ultrasonic vibration transmitted from the transducer to the resonator. Therefore, when the base portions of the first member and the second member are compressed between the resonator and the mounting table, tolerable differences in the thicknesses of the first member and the second member and a deviation from parallelism between the bonding working portion and the mounting table are absorbed, and the portions to be bonded of the first member and the second member are closely contacted to each other and directly bonded together with ultrasonic vibration properly, thereby making it possible to prevent a bonding failure between the portions to be bonded of the first member and the second member. Time and labor for applying an adhesive or solder or for heating as in the prior art can be eliminated and bonding work efficiency and the electric characteristics of the bonded portions can be improved.

What is claimed is:

1. An ultrasonic vibration bonding method by using an ultrasonic vibration bonding unit having a mounting table and a bonding working portion above said mounting table, comprising the steps of:

elastically pressing a first member having a first base portion and first bond portions provided on said first base portion and a second member having a second base portion and second bond portions between said bonding working portion and said mounting table so that all of said first and second bond portions are brought into close contact with each other without damage to said base portions; and supplying a high-frequency energy to said bonding working portion to bond said first and second bond portions together.

2. An ultrasonic vibration bonding method according to claim 1, wherein said elastically pressing step comprises the steps of:

placing an adhesive between said bond portions of said first and second members to provide an adhesive-bond portion assembly;

placing said adhesive-bond portion assembly on said mounting table such that said second base portion is on said mounting table;

descending said bonding working portion toward said adhesive-bond portion assembly to elastically pressing said first and second members between said bonding working portion and said mounting table so that all of said first and second bond portions are brought into close contact with each other without damage to said first and second base portions.

3. An ultrasonic vibration bonding method according to claim 1, wherein said elastically pressing step comprises the steps of:

providing a buffer member on an under surface of said bonding working portion;

placing said first and second members between said bonding working portions and said mounting table such that said first and second bond portions are brought into contact with each other;

descending said bonding working portion to elastically pressing said first and second members so that all of said first and second bond portions are brought into close contact with each other without damage to said first and second base portions.

4. An ultrasonic vibration bonding method according to claim 1, wherein said elastically pressing step comprises the steps of:

fixing a buffer member to said first base portion of said first member;

placing said first and second members on said mounting table such that said second base portion is on said mounting table;

descending said bonding working portion to elastically pressing said first and second members so that all of said first and second bond portions are brought into close contact with each other without damage to said first and second bases.

5. An ultrasonic vibration bonding method according to claim 1, wherein said elastically pressing step comprises the steps of:

placing said first and second members between said bonding working portion and said mounting table such that said second base portion is on said mounting table;

inserting a buffer member between said bonding working portion and said first base portion;

descending said bonding working portion to elastically pressing said first and second members so that all of said first and second bond portions are brought into close contact with each other without damage to said first and second base portions.

6. An ultrasonic vibration bonding method according to claim 1, wherein said elastically pressing step comprises the steps of:

making at least one of said first and second base portions from an elastic synthetic resin;

placing said first and second members between said bonding working portion and said mounting table;

descending said bonding working portion to elastically pressing said first and second members so that all of said first and bond portions are brought into close contact with each other without damage to said first and second base portions.

* * * * *